US010280084B2

(12) United States Patent
Murakami et al.

(10) Patent No.: US 10,280,084 B2
(45) Date of Patent: May 7, 2019

(54) SILICON NITRIDE FILM AND METHOD OF MAKING THEREOF

(71) Applicants: SPP Technologies Co., Ltd., Tokyo (JP); TAIYO NIPPON SANSO CORPORATION, Tokyo (JP)

(72) Inventors: Shoichi Murakami, Hyogo (JP); Masayasu Hatashita, Hyogo (JP); Hiroshi Taka, Tokyo (JP); Masaya Yamawaki, Tokyo (JP)

(73) Assignees: SPP TECHNOLOGIES CO., LTD., Tokyo; TAIYO NIPPON SANSO CORPORATION, Tokyo ( * ) Notice: Subject to any disclaimer, the term of this patent is extended or adjusted under 35 U.S.C. 154(b) by 0 days.

(21) Appl. No.: 15/035,744

(22) PCT Filed: Nov. 17, 2014

(86) PCT No.: PCT/JP2014/080300
§ 371 (c)(1),
(2) Date: May 10, 2016

(87) PCT Pub. No.: WO2015/079938
PCT Pub. Date: Jun. 4, 2015

(65) Prior Publication Data
US 2016/0251224 A1 Sep. 1, 2016

(30) Foreign Application Priority Data

Nov. 28, 2013 (JP) ................................. 2013-246798

(51) Int. Cl.
| C01B 21/06 | (2006.01) |
| C01B 21/068 | (2006.01) |
| C23C 16/34 | (2006.01) |
| H01L 21/02 | (2006.01) |
| C23C 16/505 | (2006.01) |
| C23C 16/509 | (2006.01) |
| C23C 16/511 | (2006.01) |
| H01J 37/32 | (2006.01) |

(52) U.S. Cl.
CPC .......... *C01B 21/068* (2013.01); *C23C 16/345* (2013.01); *C23C 16/505* (2013.01); *C23C 16/509* (2013.01); *C23C 16/511* (2013.01); *H01J 37/321* (2013.01); *H01J 37/3244* (2013.01); *H01J 37/32091* (2013.01); *H01J 37/32192* (2013.01); *H01L 21/0217* (2013.01); *H01L 21/02211* (2013.01); *H01L 21/02219* (2013.01); *H01L 21/02274* (2013.01); *H01J 2237/327* (2013.01); *H01J 2237/3321* (2013.01)

(58) Field of Classification Search
CPC ..... C01B 21/06; C01B 21/068; C23C 16/345; C23C 16/505

USPC .......................................................... 423/344
See application file for complete search history.

(56) References Cited

U.S. PATENT DOCUMENTS

| 5,234,869 | A | 8/1993 | Mikata et al. |
| 5,508,067 | A | 4/1996 | Sato et al. |
| 5,591,494 | A | 1/1997 | Sato et al. |
| 2006/0045986 | A1 | 3/2006 | Hochberg et al. |
| 2006/0105106 | A1 | 5/2006 | Balseanu et al. |
| 2007/0228944 | A1 | 10/2007 | Oosono et al. |

FOREIGN PATENT DOCUMENTS

| CN | 1940132 A | 4/2007 |
| CN | 101088150 A | 12/2007 |
| EP | 0464515 A2 | 1/1992 |
| EP | 0661386 A1 | 7/1995 |
| JP | H04-059971 A | 2/1992 |
| JP | H06-132284 A | 5/1994 |
| JP | H07-106256 A | 4/1995 |
| JP | H09-082705 A | 3/1997 |
| JP | 2004-356595 A | 12/2004 |
| JP | 2007-273094 A | 10/2007 |
| JP | 2011-089186 A | 5/2011 |

OTHER PUBLICATIONS

International Search Report for PCT/JP2014/080300, dated Feb. 3, 2015.
Written Opinion of the International Searching Authority for PCT/JP2014/080300, dated Feb. 3, 2015.
Yasui, K et al., "Silicon nitride films grown by hydrogen radical enhanced chemical vapor deposition utilizing trisdimethylaminosilane", Journal of Non-Crystalline Solids, Apr. 1, 1994, pp. 301-305, vol. 169, No. 3, North-Holland Physics Publishing, Amsterdam, NL.
European Patent Office, Extended European Search Report for EP patent application No. 14866390.9, dated Oct. 1, 2017.
State Intellectual Property Office of the People's Republic of China, Office Action for Chinese patent application No. 201480063046.6, dated Feb. 28, 2018.
Taiwan Intellectual Property Bureau Ministry of Economic Affairs, Office Action for Taiwanese patent application No. 103140587, dated Dec. 28, 2017.

(Continued)

*Primary Examiner* — Edward M Johnson

(57) ABSTRACT

A method of reducing carbon and/or hydrogen atom content ratio relative to contents of silicon atoms and nitrogen atoms in a silicon nitride film formed by a plasma CVD method using an organic silane as a material, and improving film quality such as electrical properties. A silicon nitride film is formed with the organic silane and at least one additive gas selected from a group consisting of hydrogen and ammonia by a plasma CVD method. The silicon nitride film has a carbon atom content ratio of less than 0.8 assuming that a sum of a silicon atom content and a nitrogen atom content in the silicon nitride film is 1. The silicon nitride film has improved properties such as reduced leakage current.

8 Claims, 2 Drawing Sheets

(56) References Cited

OTHER PUBLICATIONS

The State Intellectual Property Office of People's Republic of China, Second Office Action for Chinese Patent Application No. 201480063046.6, dated Sep. 20, 2018.
Japan Patent Office, Office Actions for Japanese Patent Application No. 2015-550644, dated Jun. 12, 2018.
Japan Patent Office, Office Actions for Japanese Patent Application No. 2015-550644, dated Oct. 16, 2018.
W. A. Lanford et al., "The hydrogen content of plasma-deposited silicon nitride", Journal of Applied Physics, Apr. 1978, pp. 2473-2477, vol. 49, No. 4.
Nakazawa et al., "NMR and IR Studies on Hydrogenated Amorphous Si1-xCx Films", Japanese Journal of Applied Physics, Mar. 1982, pp. L176-L178, vol. 21, No. 3.

[FIG. 1]
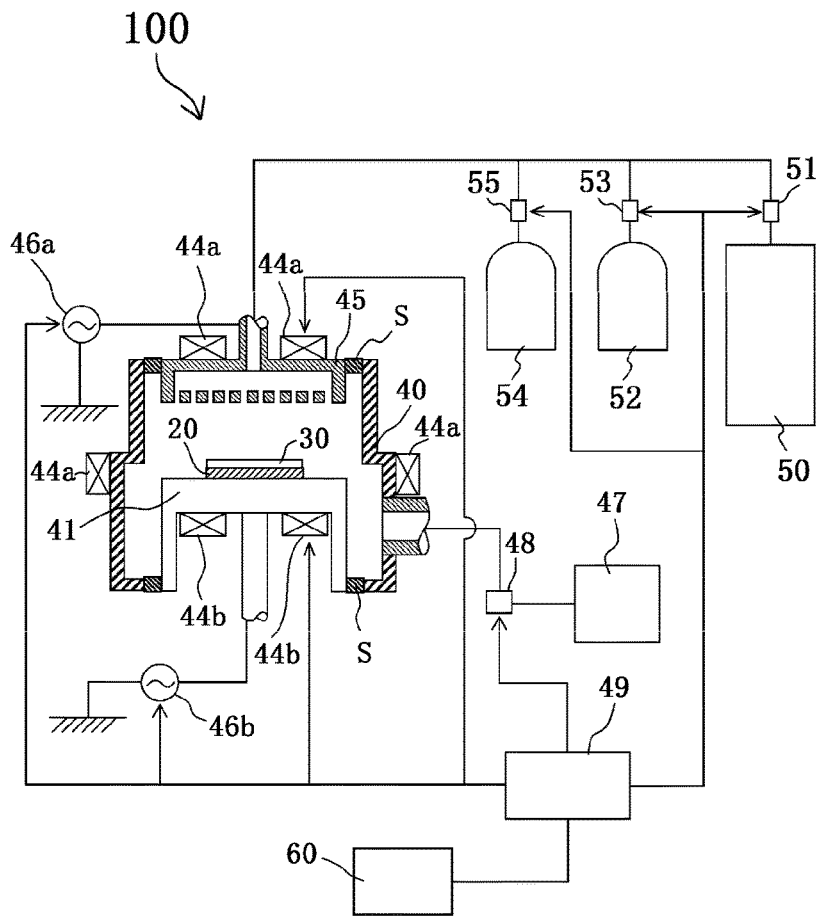
[FIG. 2]
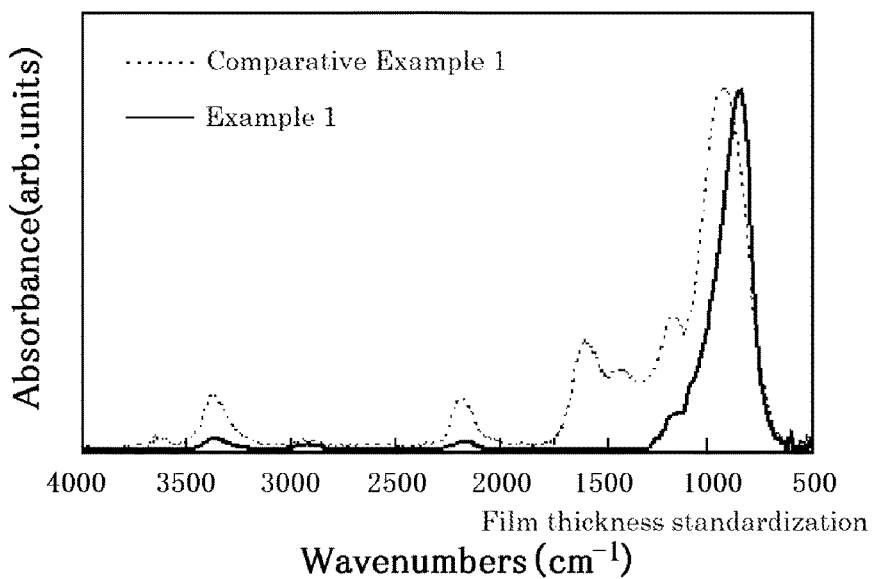

[FIG. 3]
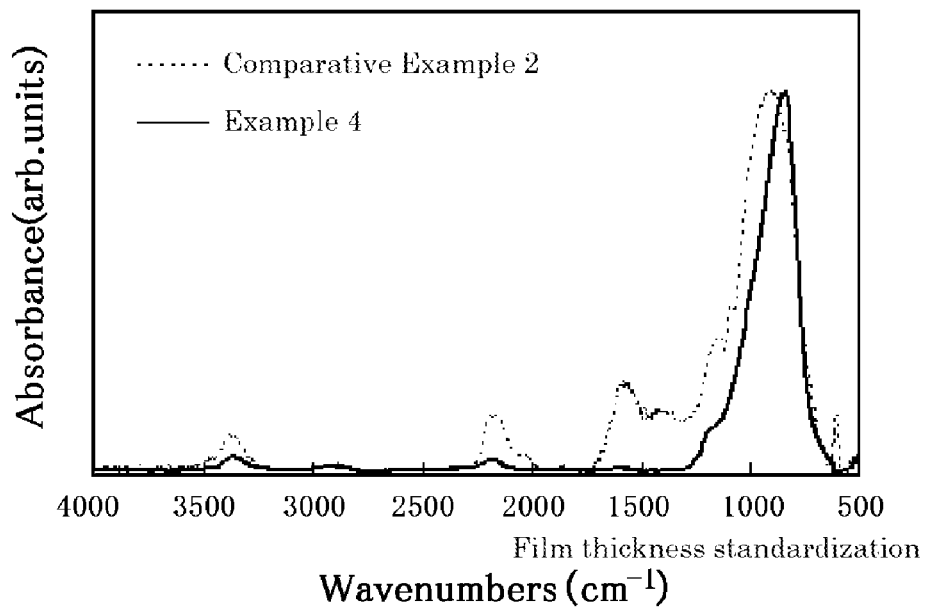
[FIG. 4]
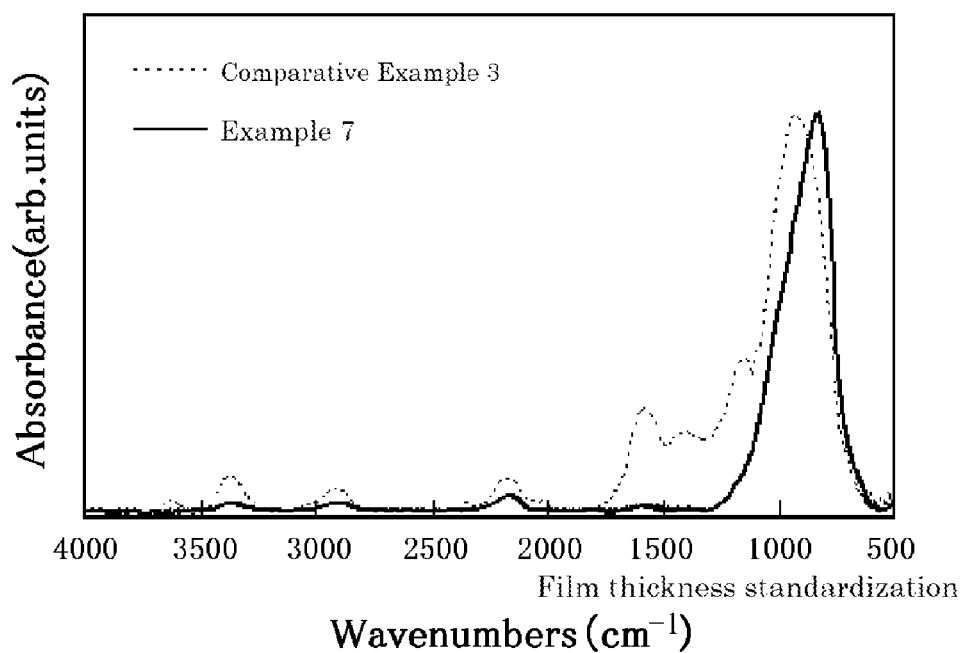

SILICON NITRIDE FILM AND METHOD OF MAKING THEREOF

TECHNICAL FIELD

The present invention relates to a silicon nitride film made of an organic silane material, a production method therefor, and a production device therefor.

BACKGROUND ART

Various devices including a semiconductor have been developed and many techniques for film formation and film processing have been disclosed to date. There has been disclosed a silicon carbonitride film according to a conventional technique, which was devised in order to solve the problem that a carbon nitride film has an unstable and small nitrogen content. There has also been disclosed an example of forming a silicon carbonitride film by a plasma CVD method using tetrakis dimethylamino silane as a material (Patent Document 1).

PRIOR ART DOCUMENT

Patent Document

Patent Document 1: Japanese Patent Laid-open Publication No. 2011-89186

SUMMARY OF THE INVENTION

Problems to be Solved by the Invention

In the production of a silicon nitride film by a plasma CVD method, an inorganic silane that has high explosibility is used. Use of an organic silane having low explosibility as a material is significant in terms of safety. However, as disclosed in Patent Document 1, a silicon nitride film formed by the plasma CVD method using an organic silane such as tetrakis dimethylamino silane as a material contains hydrocarbon groups, so that the silicon nitride film has quite a high carbon atom content (e.g. a carbon atom content ratio of 1.86 assuming that a sum of a silicon atom content and a nitrogen atom content is 1). In a silicon nitride film containing many carbon atoms and many hydrogen atoms, many C—C bonds, N—C bonds, or Si—H bonds are formed. These bonds highly possibly cause increase in leakage current and/or deterioration in wet resistance. Further improvement in properties (particularly electrical properties or wet resistance) of a silicon nitride film is thus required for improvement in reliability of various devices including the silicon nitride film.

The present invention has been devised to achieve the object mentioned above, improves various properties of a silicon nitride film, which is formed by a plasma CVD method using an organic silane as a material, and significantly contributes to improvement in reliability of various devices including the silicon nitride film.

Solutions to the Problems

The inventors of the present application have found that improvement in electrical property or wet resistance is quite difficult if the techniques as well as the technique according to Patent Document 1 for formation of a silicon nitride film using, as a material, the already disclosed organic silane, particularly due to a large carbon atom content ratio and/or a large hydrogen atom content ratio. The inventors have gone through intensive researches and repeated trial and error for solving the problems. The inventors have finally found that use of at least one particular additive gas as one of source gases along with an organic silane such as tetrakis dimethylamino silane achieves reduction in carbon atom content and/or hydrogen atom content in the silicon nitride film as well as improvement in properties of the silicon nitride film including wet resistance or electrical properties represented by leakage current. A silicon nitride film, a production method for the silicon nitride film, and a production device for the silicon nitride film according to the present invention have been devised in view of the above points.

The present invention provides an exemplary silicon nitride film formed by a plasma CVD method using an organic silane as one of materials. The silicon nitride film has a carbon atom content ratio of less than 0.8 assuming that a sum of a silicon atom content and a nitrogen atom content in the silicon nitride film is 1.

The silicon nitride film has a small carbon atom content ratio and/or a small hydrogen atom content ratio assuming that a sum of the silicon atom content and the nitrogen atom content is 1, even in the case where the organic silane is used as one of source gases. Accordingly, the silicon nitride film achieves a low leakage current value and/or high wet resistance, for example. It is thus possible to improve reliability of various devices including the silicon nitride film.

An exemplary production method for a silicon nitride film according to the present invention includes the step of forming a plasma of an organic silane and at least one additive gas selected from the group consisting of a hydrogen gas and an ammonia gas by a plasma CVD method to form a silicon nitride film.

The production method for the silicon nitride film achieves reduction in carbon atom content ratio and/or hydrogen atom content ratio assuming that a sum of a silicon atom content and a nitrogen atom content is 1, even in the case where the organic silane is used as one of source gases. This production method will achieve a low leakage current value and/or high wet resistance, for example, and will thus enable improvement in reliability of various devices including the silicon nitride film.

The present invention provides an exemplary production device for a silicon nitride film, and the device includes a gas introducing unit configured to introduce into a chamber an organic silane and at least one additive gas selected from the group consisting of a hydrogen gas and an ammonia gas, and a plasma generator configured to form a plasma of the organic silane and the additive gas in the chamber.

The production device for the silicon nitride film achieves production of a silicon nitride film having a reduced carbon atom content ratio and/or a reduced hydrogen atom content ratio assuming that a sum of a silicon atom content and a nitrogen atom content is 1, even in the case where the organic silane is used as one of source gases. Accordingly, this production device will achieve production of the silicon nitride film having a low leakage current value and/or high wet resistance, for example.

Effects of the Invention

The exemplary silicon nitride film according to the present invention achieves a low leakage current value and/or high wet resistance, for example, even in the case where the organic silane is used as one of the source gases.

The exemplary production method for the silicon nitride film according to the present invention achieves reduction in carbon atom content ratio and/or hydrogen atom content ratio assuming that a sum of the silicon atom content and the nitrogen atom content in the silicon nitride film is 1, even in the case where the organic silane is used as one of the source gases.

The exemplary production device for the silicon nitride film according to the present invention achieves production of the silicon nitride film having a reduced carbon atom content ratio and/or a reduced hydrogen atom content ratio assuming that a sum of the silicon atom content and the nitrogen atom content in the silicon nitride film is 1, even in the case where the organic silane is used as one of the source gases.

BRIEF DESCRIPTION OF THE DRAWINGS

FIG. 1 is a partial sectional view depicting a configuration of a production device for a silicon nitride film according to an embodiment of the present invention.

FIG. 2 is a graph indicating measurement results of infrared absorption spectra of silicon nitride films according to Example 1 and Comparative Example 1.

FIG. 3 is a graph indicating measurement results of infrared absorption spectra of silicon nitride films according to Example 4 and Comparative Example 2.

FIG. 4 is a graph indicating measurement results of infrared absorption spectra of silicon nitride films according to Example 7 and Comparative Example 3.

EMBODIMENTS OF THE INVENTION

An embodiment of the present invention will now be described in detail with reference to the accompanying drawings. Common parts will be denoted by common reference signs throughout all the drawings in this description. Elements according to the present embodiment will not always be depicted at relative scale ratios in the drawings. Flow rates of various gases to be indicated below will be under a standard condition.

First Embodiment

FIG. 1 is a partial sectional view depicting a configuration of a production device 100 for a silicon nitride film according to the present embodiment. This drawing is a schematic view in which peripheral devices including part of a known gas feed mechanism and part of a known exhaust mechanism are not depicted.

A substrate 20 conveyed by a substrate conveying chamber (not depicted) is mounted on a stage 41 that is provided substantially in the center of a chamber 40. The substrate 20 and the interior of the chamber 40 are heated by heaters 44a and 44b provided on an outer wall of the chamber 40. The chamber 40 is connected with an organic silane cylinder 50 containing an organic silane gas as one of source gases, via a gas flow regulator 51. Typical examples of the organic silane gas according to the present embodiment include tetrakis dimethylamino silane, tris dimethylamino silane, and bis diethylamino silane.

The chamber 40 is also connected with a gas cylinder 54 containing a hydrogen ($H_2$) gas as an additive gas to be introduced into the chamber 40 along with the organic silane gas according to the present embodiment, via a gas flow regulator 55. The chamber 40 is further connected with a gas cylinder 52 containing an ammonia ($NH_3$) gas as an additive gas to be introduced into the chamber 40 in place of or along with hydrogen, via a gas flow regulator 53. The chamber 40 includes a shower head gas introducing unit 45.

According to the present embodiment, the organic silane gas as well as at least one additive gas selected from the group consisting of the hydrogen gas and the ammonia gas are introduced from the shower head gas introducing unit 45 into the chamber 40. Piping from the organic silane cylinder 50 to the chamber 40 is heated by a heater (not depicted) to about 200° C., for example.

The shower head gas introducing unit 45 is electrically insulated from the chamber 40 by a sealant S in a ring shape. The stage 41 is also electrically insulated from the chamber 40 by a sealant S in a ring shape. The chamber 40 is also connected, via an exhaust flow regulator 48, with a vacuum pump 47 configured to depressurize the interior of the chamber 40 and discharge a gas to be generated after processing. The exhaust flow regulator 48 changes an exhaust flow rate from the chamber 40. There is provided a controller 49 configured to control the gas flow regulators 51, 53, and 55, the heaters 44a and 44b, power supplies 46a and 46b, and the exhaust flow regulator 48.

The gases fed from the organic silane cylinder 50, the hydrogen gas cylinder 54, and the ammonia gas cylinder 52 eventually pass through an identical channel to reach the chamber 40. The power supply 46a applies electric power of a predetermined frequency to the shower head gas introducing unit 45 to form a plasma of the gases discharged from the shower head gas introducing unit 45. The plasma thus generated reaches the substrate 20 on the stage 41 to which the power supply 46b applies electric power of a predetermined frequency as necessary. The substrate 20 exposed to the plasma is provided thereon with a silicon nitride film. The frequency of the applied electric power is not particularly limited in the present embodiment. At least some of the effects of the present embodiment will be obtained in either case where the frequency is low (e.g. 380 kHz) or high (e.g. 13.56 MHz).

The production device 100 for a silicon nitride film according to the present embodiment includes the controller 49 connected to a computer 60. The computer 60 monitors or integrally controls a production process for a silicon nitride film in accordance with a production program for a silicon nitride film 30 referred to for execution of the production process. The production program according to the present embodiment is stored in a hard disk drive in the computer 60 or a known recording medium such as an optical disk inserted to an optical disk drive provided to the computer 60. The production program is not limited in terms of its stored place. Alternatively, this production program is partially or entirely stored in the controller 49 included in each processing chamber according to the present embodiment. Still alternatively, the production process is monitored or controlled in accordance with the production program via a local area network, an internet connection, or the like according to a known technique.

Production Method for Silicon Nitride Film

A production method for a silicon nitride film will be described next. The production method for the silicon nitride film according to the present embodiment includes the step of forming a plasma of an organic silane and at least one additive gas selected from the group consisting of a hydrogen gas and an ammonia gas by a plasma CVD method to form a silicon nitride film.

The silicon nitride film according to the present embodiment is made from materials including the organic silane gas by the plasma CVD method. As described above, typical examples of the organic silane gas according to the present embodiment include tetrakis dimethylamino silane, tris dimethylamino silane, and bis diethylamino silane.

According to the present embodiment, the substrate 20 to be treated is initially mounted on the stage in the chamber 40. The substrate 20 is heated and is subsequently exposed, in the chamber 40, to the organic silane gas and the additive gas thus formed into a plasma by the plasma CVD method. As a result, a silicon nitride film is formed on the substrate 20. The additive gas according to the present embodiment is at least one gas selected from the group consisting of the hydrogen gas and the ammonia gas. These additive gases will contribute to generation of a hydrogen radical to be used for removing carbon atoms or hydrogen atoms in the silicon nitride film in the form of a hydrocarbon gas or a hydrogen gas.

A leakage current value and/or wet resistance is likely to deteriorate if the silicon nitride film contains many carbon atoms and/or many hydrogen atoms. Accordingly, it is not preferred that the carbon atoms and/or the hydrogen atoms remain in the silicon nitride film. For example, a tetrakis dimethylamino silane molecule includes a methyl group. According to a result of theoretical chemical calculation (the Gaussian 09 program, B3LYP/cc-pVDZ) of bond dissociation energy of tetrakis dimethylamino silane by the inventors of the present application, a bond between nitrogen and carbon (N—C bond) is most likely to be dissociated from each other. Carbon atoms and/or the hydrogen atoms are thus less likely to be contained in the silicon nitride film. However, the methyl group may further be dissociated and carbon atoms and/or the hydrogen atoms may be contained in the silicon nitride film. In view of this, the present embodiment achieves improvement in properties of the silicon nitride film by introduction of the respective additive gases, which promotes removal of carbon atoms and/or the hydrogen atoms in a reaction system during the formation process of the silicon nitride film in the form of a hydrocarbon gas and/or a hydrogen gas.

The silicon nitride film is produced under the following specific production conditions in the present embodiment. First, the chamber 40 is fed with the organic silane gas and the additive gas until internal pressure of the chamber 40 reaches a predetermined level. The internal pressure of the chamber 40 is preferably 10 Pa or more and 500 Pa or less in terms of a residence time of the materials in the chamber, for allowing the materials to be decomposed in the plasma and react on the substrate. The organic silane gas preferably has a flow rate of 0.05 sccm or more and 500 sccm or less in terms of productivity and sufficient decomposition of the materials. Furthermore, a mixing ratio between hydrocarbon molecules contained in the organic silane gas and hydrogen atoms contained in the additive gas is preferably in the range from 1:1 to 1:300 in terms of generation of a hydrocarbon gas and/or a hydrogen gas from carbon atoms and/or hydrogen atoms and its productivity.

The stage 41 is heated by the heater 44b in the present embodiment until the temperature of the stage 41 reaches a predetermined level. The temperature of the stage 41 has an upper limit that is not particularly limited, but is preferably set to 500° C. or less in terms of cost efficiency and productivity. The temperature of the stage 41 is further preferably set to 400° C. or less in terms of the same points. Electric power of the predetermined frequency is subsequently applied to the shower head gas introducing unit 45.

The silicon nitride film is produced by the above process. The silicon nitride film produced at 400° C. or less by the production method for the silicon nitride film of the present embodiment has a carbon atom content ratio of less than 0.8 assuming that a sum of a silicon atom content and a nitrogen atom content in the silicon nitride film is 1. Reduction in content ratio of the carbon atoms in the silicon nitride film will highly possibly improve reliability of various devices including the silicon nitride film. In terms of the above points, the silicon nitride film preferably has a carbon atom content ratio of less than 0.4 and more preferably less than 0.2 assuming that a sum of the silicon atom content and the nitrogen atom content in the silicon nitride film is 1.

The silicon nitride film according to the present embodiment achieves reduction in content by percentage of the hydrogen atoms as well as the carbon atoms. Specifically, the silicon nitride film produced at 400° C. or less by the production method for the silicon nitride film according to the present embodiment has a carbon atom content ratio of less than 0.9 assuming that a sum of the silicon atom content and the nitrogen atom content in the silicon nitride film is 1. Reduction in content ratio of the hydrogen atoms in the silicon nitride film will highly possibly improve reliability of various devices including the silicon nitride film. In terms of the above points, the silicon nitride film preferably has a hydrogen atom content ratio of less than 0.6 and more preferably less than 0.5 assuming that a sum of the silicon atom content and the nitrogen atom content in the silicon nitride film is 1.

The silicon nitride film according to the present embodiment achieves a leakage current value of less than $1.0 \times 10^{-6}$ $A/cm^2$ at a field intensity of 1 MV/cm. When the leakage current value at a field intensity of 1 MV/cm is less than $1.0 \times 10^{-8}$ $A/cm^2$, the silicon nitride film according to the present embodiment will sufficiently serve as an insulating layer. As to be described later, it is worth mentioning that the silicon nitride film made from tetrakis dimethylamino silane as the organic silane gas according to the present embodiment achieves a leakage current value of less than $2.6 \times 10^{-9}$ $A/cm^2$.

EXAMPLES

Examples and comparative examples will be described below, but the present invention is not limited to these examples. In each of the examples and the comparative examples, physical properties of the silicon nitride film were measured and composition of the silicon nitride film was analyzed by the following methods.

1. Contents by Percentage of Elements in Silicon Nitride Film

Elemental analysis was performed in accordance with Rutherford Backscattering spectrometry (RBS spectrometry) and Hydrogen Forward Scattering spectrometry (HFS spectrometry) to obtain atomic composition percentages (at %) of carbon atoms (C), hydrogen atoms (H), silicon atoms (Si), and nitrogen atoms (N) in the silicon nitride film according to each of the examples and the comparative examples.

2. Infrared Absorption Analysis

An infrared absorption spectrum of the silicon nitride film was analyzed. The infrared absorption spectrum was measured using a Fourier transform infrared spectrophotometer (FTIR spectrophotometer).

3. Measurement of Leakage Current Value

The leakage current value of the silicon nitride film was measured by means of IV measurement using a mercury probe.

4. Wet Resistance Evaluation

The silicon nitride films according to some of the examples to be mentioned below were analyzed also in terms of wet resistance. The wet resistance was evaluated by execution of a pressure cooker test (PCT). The PCT was executed at 2 atm and 121° C. for 6 hours. This evaluation was made by calculating hygroscopicity from an FTIR spectrum. It is known that a Si—N bond is replaced with a Si—O bond when a silicon nitride film absorbs moisture. The evaluation was thus made based on a numerical value obtained by subtracting Si—N absorption intensity from Si—O absorption intensity. Accordingly, a smaller numerical value indicates higher wet resistance.

Production Conditions According to Examples and Comparative Examples

Example 1

A silicon nitride film according to Example 1 was produced by the production method of the first embodiment. Tetrakis dimethylamino silane was used as the organic silane gas as one of the materials and a hydrogen gas was used as the additive gas. The internal pressure of the chamber 40 was set to 93.3 Pa, and 1 sccm of tetrakis dimethylamino silane and 400 sccm of the hydrogen gas were fed. Electric power of 13.56 MHz and 600 W was applied to the shower head gas introducing unit 45. The temperature of the stage was set to 300° C.

Example 2

A silicon nitride film was produced under conditions similar to those of Example 1 except that a hydrogen gas and an ammonia gas were used as the additive gases as source gases, and were fed at flow rates of 300 sccm and 100 sccm, respectively.

Example 3

A silicon nitride film was produced under conditions similar to those of Example 1 except that an ammonia gas was used as the additive gas as a source gas, and was fed at a flow rate of 400 sccm.

Example 4

A silicon nitride film was produced under conditions similar to those of Example 1 except that tris dimethylamino silane was used as the organic silane gas as a source gas, and was fed at a flow rate of 1 sccm.

Example 5

A silicon nitride film was produced under conditions similar to those of Example 2 except that tris dimethylamino silane was used as the organic silane gas, and was fed at a flow rate of 1 sccm.

Example 6

A silicon nitride film was produced under conditions similar to those of Example 3 except that tris dimethylamino silane was used as the organic silane gas, and was fed at a flow rate of 1 sccm.

Example 7

A silicon nitride film was produced under conditions similar to those of Example 1 except that bis diethylamino silane was used as the organic silane gas as a source gas, and was fed at a flow rate of 1 sccm.

Example 8

A silicon nitride film was produced under conditions similar to those of Example 2 except that bis diethylamino silane was used as the organic silane gas as a source gas, and was fed at a flow rate of 1 sccm.

Example 9

A silicon nitride film was produced under conditions similar to those of Example 3 except that bis diethylamino silane was used as the organic silane gas as a source gas, and was fed at a flow rate of 1 sccm.

Comparative Example 1

A silicon nitride film according to Comparative Example 1 was produced under conditions similar to those of Example 1 except that a helium gas was used as a diluent gas incapable of providing any hydrogen radical, and was fed at a flow rate of 400 sccm.

Comparative Example 2

A silicon nitride film according to Comparative Example 2 was produced under conditions similar to those of Example 4 except that a helium gas was used as a diluent gas incapable of providing any hydrogen radical, and was fed at a flow rate of 400 sccm.

Comparative Example 3

A silicon nitride film according to Comparative Example 3 was produced under conditions similar to those of Example 7 except that a helium gas was used as a diluent gas incapable of providing any hydrogen radical, and was fed at a flow rate of 400 sccm.

5. Evaluation Results (1) Content Ratios of Carbon Atoms and Hydrogen Atoms in Silicon Nitride Film Carbon atom content ratios and hydrogen atom content ratios assuming that a sum of a silicon atom content and a nitrogen atom content obtained from the contents by percentage of the elements in the silicon nitride film according to each of Examples 1 to 9 and Comparative Examples 1 to 3 is 1, as well as electrical properties and evaluation results of wet resistance of the silicon nitride films are shown in Table 1.

TABLE 1

| One of source gases (Organic silane gas) | Composition ratio/ measurement target | Example 1 | Example 2 | Example 3 | Comparative Example 1 |
|---|---|---|---|---|---|
| Tetrakis dimethylamino silane (4DMAS) | C/(Si + N) | 0.18 | 0.14 | 0.13 | 0.91 |
| | H/(Si + N) | 0.44 | 0.44 | 0.48 | 0.94 |
| | Leakage current (A/cm$^2$) | 4.77E−09 | 2.87E−09 | 2.56E−09 | 2.72E−06 |
| | Wet resistance evaluation | 0.002 | 0.003 | 0.003 | 0.08 |
| | Composition ratio/ measurement target | Example 4 | Example 5 | Example 6 | Comparative Example 2 |
| Tris dimethylamino silane (3DMAS) | C/(Si + N) | 0.19 | 0.14 | 0.13 | 0.86 |
| | H/(Si + N) | 0.42 | 0.44 | 0.48 | 0.92 |
| | Leakage current (A/cm$^2$) | 2.67E−09 | 2.38E−09 | 2.11E−09 | 5.66E−06 |
| | Wet resistance evaluation | 0.002 | 0.003 | 0.002 | 0.05 |
| | Composition ratio/ measurement target | Example 7 | Example 8 | Example 9 | Comparative Example 3 |
| Bis diethylamino silane (BDEAS) | C/(Si + N) | 0.38 | 0.31 | 0.28 | 0.94 |
| | H/(Si + N) | 0.51 | 0.54 | 0.57 | 0.91 |
| | Leakage current (A/cm$^2$) | 8.55E−07 | 6.78E−07 | 5.22E−07 | 5.20E−06 |
| | Wet resistance evaluation | 0.002 | 0.004 | 0.003 | 0.04 |

It is a preferred aspect in terms of more reliable achievement of the effects of the silicon nitride film according to the first embodiment that the carbon atom content ratio is less than 0.8 assuming that a sum of the silicon atom content and the nitrogen atom content is 1 in the silicon nitride film according to each of Examples 1 to 9 in which tetrakis dimethylamino silane, tris dimethylamino silane, or bis diethylamino silane was used as one of the source gases. It is worth mentioning that the silicon nitride film has a carbon atom content ratio of 0.13 or more and 0.19 or less assuming that a sum of the silicon atom content and the nitrogen atom content is 1 in the silicon nitride film produced using tetrakis dimethylamino silane or tris dimethylamino silane as the organic silane gas according to the present embodiment.

In Comparative Examples 1 to 3, the silicon nitride film was found to have a carbon atom content ratio of 0.8 or more assuming that a sum of the silicon atom content and the nitrogen atom content in the silicon nitride film is 1.

(2) Infrared Absorption Analysis

FIGS. 2 to 4 indicate absorbance spectra according to Examples 1, 4, and 7 as well as Comparative Examples 1 to 3 as representative examples. FIGS. 2 to 4 indicate peaks at about a wavenumber of 850 cm$^{-1}$ due to Si—N stretching vibration absorption, peaks at about a wavenumber of 2180 cm$^{-1}$ due to Si—H stretching vibration absorption, peaks at about a wavenumber of 2950 cm$^{-1}$ due to C—H stretching vibration absorption, and peaks at about a wavenumber of 3380 cm$^{-1}$ due to N—H stretching vibration absorption. Peak intensity ratios of Si—H, C—H, and N—H to Si—N peak intensity are shown in Table 2. In comparison to Comparative Examples 1 to 3 in which no additive gas was used, Examples 1, 4, and 7 had less absorption of the carbon atoms and the hydrogen atoms. It is thus found that use of an additive gas leads to reduction in carbon atom content.

TABLE 2

| One of source gases (Organic silane gas) | Intensity ratio/ measurement target | Example 1 | Comparative Example 1 |
|---|---|---|---|
| Tetrakis dimethylamino silane (4DMAS) | Si—H/Si—N | 0.0234 | 0.13259 |
| | N—H/Si—N | 0.0254 | 0.10367 |
| | C—H/Si—N | 0.0183 | 0.01833 |

TABLE 2-continued

| One of source gases (Organic silane gas) | Intensity ratio/ measurement target | Example 1 | Comparative Example 1 |
|---|---|---|---|
| | Intensity ratio/ measurement target | Example 4 | Comparative Example 2 |
| Tris dimethylamino silane (3DMAS) | Si—H/Si—N | 0.0303 | 0.1451 |
| | N—H/Si—N | 0.0282 | 0.0743 |
| | C—H/Si—N | 0.0161 | 0.0268 |
| | Intensity ratio/ measurement target | Example 7 | Comparative Example 3 |
| Bis diethylamino silane (BDEAS) | Si—H/Si—N | 0.0376 | 0.0821 |
| | N—H/Si—N | 0.0148 | 0.0750 |
| | C—H/Si—N | 0.0188 | 0.0544 |

(3) Leakage Current

The leakage current value at a field intensity of 1 MV/cm according to each of the examples was less than $1.0 \times 10^{-6}$ A/cm$^2$. It was found that the leakage current decreases as a result of a decrease in the carbon atom content ratio and/or the hydrogen atom content ratio assuming that a sum of the silicon atom content and the nitrogen atom content is 1, in comparison to that according to each of the comparative examples.

(4) The wet resistance evaluated in each of the examples was less than 0.04. It was found that the wet resistance improves as a result of a decrease in the carbon atom content ratio and/or the hydrogen atom content ratio assuming that a sum of the silicon atom content and the nitrogen atom content is 1, in comparison to that according to each of the comparative examples.

The measurement results according to each of the examples indicate that a preferred leakage current value and good wet resistance are achieved when the carbon atom content ratio and/or the hydrogen atom content ratio is decreased significantly assuming that a sum the silicon atom content and the nitrogen atom content in the silicon nitride film is 1.

The silicon nitride film according to the embodiment described above thus achieves reduced leakage current as well as higher wet resistance since the carbon atom content ratio is small assuming that a sum of at least the silicon atom content and the nitrogen atom content in the silicon nitride film is 1. Furthermore, in the silicon nitride film according to the embodiment described above, reduction in hydrogen atom content ratio is achieved assuming that a sum of the silicon atom content and the nitrogen atom content in the silicon nitride film is 1. Thus, it is made possible to suppress or prevent temporal variation in quality of the silicon nitride film. Application of the silicon nitride film according to the above embodiment achieving improvement in insulation and wet resistance as an insulating film, a dielectric film, a passivation film, or the like of various electronic devices significantly contributes to improvement in reliability and/or properties of these devices.

Other Embodiments

The hydrogen gas and/or the ammonia gas is used as an additive gas in the above embodiment. According to another adoptable aspect, a deuterium gas is used as a different additive gas in place of or along with the hydrogen gas.

The above embodiment adopts a plasma generator configured to generate a parallel-plate capacitive-coupled plasma (CCP), but the present invention is not limited thereto. The effects of the present invention will also be achieved by alternatively using a plasma generator configured to generate a different high-density plasma such as an inductively-coupled plasma (ICP) or an electron-cyclotron resonance plasma (ECR).

The above embodiments have been disclosed for description of these embodiments and not for limitation to the present invention. Any modification example within the scope of the present invention, inclusive of other combinations of the embodiments, will also be included within the scope of patent claims.

DESCRIPTION OF REFERENCE SIGNS

20 Substrate
30, 130 Silicon nitride film
41 Stage
50, 52, 54 Gas cylinder
50 Organic silane cylinder
51, 53, 55 Gas flow regulator
40 Chamber
46a, 46b Power supply
47 Vacuum pump
48 Exhaust flow regulator
49 Controller
44a, 44b Heater
45 Shower head gas introducing unit
100 Production device for silicon nitride film

The invention claimed is:

1. A silicon nitride film formed by a plasma CVD method using an organic silane as one of materials, wherein the materials do not include an inorganic silane, and the silicon nitride film has a carbon atom content ratio of less than 0.8 assuming that a sum of a silicon atom content and a nitrogen atom content in the silicon nitride film is 1.

2. The silicon nitride film according to claim 1, wherein the silicon nitride film has a hydrogen atom content ratio of less than 0.9 assuming that a sum of the silicon atom content and the nitrogen atom content in the silicon nitride film is 1.

3. The silicon nitride film according to claim 1, having a leakage current value of less than $1.0 \times 10^{-6}$ A/cm$^2$ at a field intensity of 1 MV/cm.

4. The silicon nitride film according to claim 1, wherein the organic silane is tetrakis dimethylamino silane, tris dimethylamino silane, or bis diethylamino silane.

5. A device comprising the silicon nitride film according to claim 1 as an insulating film, a dielectric film, or a passivation film.

6. A production method for a silicon nitride film formed by a plasma CVD method using an organic silane as one of materials, the method comprising:
    forming a plasma of the organic silane and at least one additive gas selected from the group consisting of a hydrogen gas and an ammonia gas by the plasma CVD method to form the silicon nitride film,
    wherein the materials do not include an inorganic silane, and the silicon nitride film has a carbon atom content ratio of less than 0.8 assuming that a sum of a silicon atom content and a nitrogen atom content in the silicon nitride film is 1.

7. The production method for the silicon nitride film according to claim 6, wherein the silicon nitride film has a hydrogen atom content ratio of less than 0.9 assuming that a sum of a silicon atom content and a nitrogen atom content in the silicon nitride film is 1.

8. The production method for the silicon nitride film according to claim 6, wherein the organic silane is tetrakis dimethylamino silane, tris dimethylamino silane, or bis diethylamino silane.

* * * * *